United States Patent
Ahn et al.

(10) Patent No.: US 10,739,644 B2
(45) Date of Patent: Aug. 11, 2020

(54) SUBSTRATE, LIQUID CRYSTAL DISPLAY DEVICE INCLUDING THE SAME AND METHOD OF FABRICATING THE SAME

(71) Applicant: LG Display Co., Ltd., Seoul (KR)

(72) Inventors: Han-Jin Ahn, Seoul (KR); Dong-Jin Kim, Paju-si (KR); Hyun-Sook Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 214 days.

(21) Appl. No.: 15/844,885

(22) Filed: Dec. 18, 2017

(65) Prior Publication Data

US 2018/0173061 A1 Jun. 21, 2018

(30) Foreign Application Priority Data

Dec. 16, 2016 (KR) .................. 10-2016-0172769

(51) Int. Cl.
*G02F 1/1337* (2006.01)
*C09K 19/56* (2006.01)
*C08L 79/08* (2006.01)
*H01L 27/12* (2006.01)
*C09D 179/08* (2006.01)
*C08G 73/10* (2006.01)

(52) U.S. Cl.
CPC ........ *G02F 1/133723* (2013.01); *C08L 79/08* (2013.01); *C09D 179/08* (2013.01); *C09K 19/56* (2013.01); *G02F 1/133788* (2013.01); *H01L 27/1259* (2013.01); *C08G 73/10* (2013.01); *G02F 2001/133796* (2013.01); *G02F 2202/16* (2013.01); *G02F 2202/36* (2013.01)

(58) Field of Classification Search
CPC ......... G02F 1/133723; G02F 1/133788; G02F 2001/133796
USPC .......................................... 347/124
See application file for complete search history.

(56) References Cited

U.S. PATENT DOCUMENTS

2014/0368779 A1* 12/2014 Park .................. G02F 1/133723
349/124
2016/0004125 A1* 1/2016 Li ........................ C09K 19/56
252/512

FOREIGN PATENT DOCUMENTS

| CN | 1319198 A | 10/2001 |
| CN | 1922540 A | 2/2007 |
| CN | 101178519 A | 5/2008 |
| CN | 103676331 A | 3/2014 |
| CN | 105308498 A | 2/2016 |
| JP | 2005-157346 A | 6/2005 |
| KR | 10-2015-0067903 A | 6/2015 |

OTHER PUBLICATIONS

Chinese Office Action and Search Report dated Jun. 3, 2020 in a counterpart Chinese Application No. CN 201711352245.0 with English translation (23 pages).

(Continued)

*Primary Examiner* — John A McPherson
(74) *Attorney, Agent, or Firm* — Polsinelli PC

(57) ABSTRACT

A substrate for a liquid crystal display device includes: a substrate; and an alignment film on the substrate, the alignment film including an alignment material of a photo alignment material and a conductive particle.

10 Claims, 4 Drawing Sheets

(56) References Cited

OTHER PUBLICATIONS

Xiao Liang et al., Study on the Surface Orientation Properties of Polyimide Derived from Cyclobutanetetracarboxylic Dianhydride, Journal of Functional Materials No. S1, Dec. 31, 2000. (Abstract).
Hideo Suzuki, The Synthesis and X-Ray Structure of 1,2,3,4-Cyclobutane Tetracarboxylic Dianhydride and the Preparation of a New Type of Polyimide Showing Excellent Transparency and Heat Resistance, Journal of Polymer Science: Part A: Polymer Chemistry vol. 38, Jan. 21, 2000, pp. 108-116.

* cited by examiner

SUBSTRATE, LIQUID CRYSTAL DISPLAY DEVICE INCLUDING THE SAME AND METHOD OF FABRICATING THE SAME

CROSS-REFERENCE TO RELATED APPLICATION

This application claims the benefit under 35 U.S.C. § 119(a) of Korean Patent Application No. 10-2016-0172769, filed on Dec. 16, 2016, in the Korean Intellectual Property Office, which is incorporated herein by reference in its entirety.

BACKGROUND

Technical Field

The present disclosure relates to a display device, and more particularly, to a substrate including an alignment film of a single-layered structure, a liquid crystal display device including the substrate and a method of fabricating the substrate.

Description of the Background

As the information age progresses, display devices processing and displaying a large amount of information have been developed. In addition, flat panel display (FPD) devices having a thin profile, a light weight and a low power consumption have been the subject of recent research.

Accordingly, a liquid crystal display (LCD) device having an excellent color reproducibility and a thin profile has been developed. The LCD device displays an image using an optical anisotropy and a polarization property of liquid crystal molecules.

The LCD device includes a liquid crystal panel having two substrates and a liquid crystal layer between the two substrates and a backlight unit under the liquid crystal panel. An alignment direction of the liquid crystal molecule is changed by an electric field in the liquid crystal panel and an image is displayed due to a transmittance difference with respect to light from the backlight unit.

The LCD device includes lower and upper substrates facing and spaced apart from each other and a liquid crystal layer between the lower and upper substrates. A thin film transistor, a pixel electrode and a lower alignment film are formed on an inner surface of the lower substrate, and a color filter layer, a planarizing layer and an upper alignment film are formed on an inner surface of the upper substrate.

In the LCD device, the lower and upper alignment films are formed through a rubbing process or through an ultraviolet irradiating process to alignment material layers.

Liquid crystal molecules of the liquid crystal layer adjacent to the alignment film through the rubbing process have a relatively great pre-tilt angle, and the liquid crystal molecules of the liquid crystal layer adjacent to the alignment film through the ultraviolet irradiating process have a relatively small pre-tilt angle. As a result, an LCD device including the alignment film through the ultraviolet irradiating process has a uniform viewing angle property along the diagonal direction.

The alignment film through the ultraviolet irradiating process includes a photo reactive group, and the photo reactive group is classified into an isomerization type, a cross-linking type and a decomposition type.

The isomerization type photo reactive group such as azobenzene has a uniaxial alignment property through an isomerization reaction by a polarized ultraviolet of a wavelength of about 365 nm. The cross-linking type photo reactive group such as cinnamate has a uniaxial alignment property through a cross-linking reaction by a polarized ultraviolet of a wavelength of about 313 nm. The decomposition type photo reactive group such as cyclobutane dianhydride (CBDA) has a uniaxial alignment property through a decomposition reaction by a polarized ultraviolet of a wavelength of about 254 nm.

Here, since the alignment film by the isomerization type photo reactive group and the cross-linking type photo reactive group have a relatively small anchoring energy, a contrast ratio is reduced a. In addition, deterioration such as a residual image is caused, and reliability is reduced.

Since the alignment film by the decomposition type photo reactive group has a relatively great anchoring energy, a proper contrast ratio is obtained. In addition, a residual image is prevented and reliability is obtained.

The alignment film by the decomposition type photo reactive group has a resistivity of about $10^{15}$ Ωcm. Since the resistivity of the alignment film by the decomposition type photo reactive group is relatively high as compared with a resistivity of a liquid crystal layer over the alignment film and a passivation layer under the alignment film in the LCD device, a charge of a direct current (DC) component generated during an operation is not discharged and is accumulated in the alignment film. The accumulated charge causes a residual image and deterioration such as Yogore (i.e., dirty), thereby to reduce reliability.

To improve the above disadvantages, an alignment film of a double-layered structure including a lower alignment layer having a relatively low resistivity and an upper alignment layer having a relatively high resistivity has been suggested.

FIGS. 1A and 1B are views showing an alignment film of a double-layered structure according to the related art before and after an ultraviolet irradiating process, respectively.

In FIG. 1A, for fabricating an alignment film of a double-layered structure according to the related art, after an alignment film 40 is formed by coating a mixed alignment material of a first alignment material not including a photo-reactive group and a second alignment material including a photo-reactive group, a drying process is performed. During the drying process, the first and second alignment materials are divided by a phase separation due to a polar difference and a molecular weight difference to form a first alignment layer 42 of a lower portion and a second alignment layer 44 of an upper portion.

Here, the first alignment material includes pyromellitic dianhydride (PMDA), and the second alignment material includes cyclobutane dianhydride (CBDA).

The first alignment layer 42 of a first thickness t1 has a resistivity of about $10^{11}$ Ωcm to about $10^{13}$ Ωcm, and the second alignment layer 44 of a second thickness t2 has a resistivity of about $10^{15}$ Ωcm. A mixing ratio of the first and second alignment materials is one of about 7:3, about 6:4, about 5:5 and about 4:6. The entire the alignment film 40 has a resistivity of about $10^{13}$ Ωcm to about $10^{14}$ Ωcm.

After the drying process, the photo-reactive group of the second alignment layer 44 selectively decomposes through a heating process and an ultraviolet irradiating process to generate a decomposition by-product of the photo-reactive group.

When the decomposition by-product is not removed, deterioration such as a bright point, a residual image and reduction of reliability can occur. As a result, the decomposition by-product should be removed through an organic cleaning process and a heat treating process.

In FIG. 1B, after the organic cleaning process and the heat treatment process, since the decomposition by-product of the photo-reactive group of the second alignment layer 44 is removed, the first alignment layer 42 has the first thickness t1 and the second alignment layer 44 has a third thickness t3 smaller than the second thickness t2. The second alignment layer corresponding to about 10% to about 20% of the second thickness t2 may be removed.

For example, when the mixing ratio of the first and second alignment materials in the mixed alignment material is about 5:5 and the alignment film 40 by the mixed alignment material has a thickness of about 1000 Å, each of the first and second thicknesses t1 and t2 before the ultraviolet irradiating process may be about 500 Å. Since about 10% of the second alignment layer 44 decomposes by the ultraviolet irradiating process, the third thickness t3 after the organic cleaning process and the heat treating process may be about 450 Å.

In addition, when the mixing ratio of the first and second alignment materials in the mixed alignment material is about 7:3 and the alignment film 40 by the mixed alignment material has a thickness of about 500 Å, the first and second thicknesses t1 and t2 before the ultraviolet irradiating process may be about 350 Å and about 150 Å, respectively. Since about 20% of the second alignment layer 44 decomposes by the ultraviolet irradiating process, the third thickness t3 after the organic cleaning process and the heat treating process may be about 120 Å.

When the thickness of the alignment film is reduced, an amount of a material is reduced and a fabrication cost is reduced. However, when the thickness is reduced less than a critical value, a residual image property and a reliability property of the LCD device may be deteriorated. Specifically, deterioration of property may seriously occur in the alignment film formed through the ultraviolet irradiating process.

Since the liquid crystal layer is aligned by an uneven shape of a surface of the alignment film through the rubbing process, an alignment force of the alignment film does not depend on the thickness of the alignment film. However, since the liquid crystal layer is aligned by a van der Waals force between a polymer chain of the alignment material of the alignment film through the ultraviolet irradiating process and a benzene ring of the liquid crystal molecule and the van der Waals force is proportional to the thickness, an alignment force of the alignment film is proportional to the thickness of the alignment film.

As a result, when the thickness of the alignment film through the ultraviolet irradiating process is reduced, the alignment force of the alignment film is reduced and a sufficient property in a contrast ratio, a residual image and reliability is not obtained.

In FIG. 1B, for example, when the second alignment layer 44 has the third thickness of about 450 Å, the alignment film 40 has a relatively strong alignment force. As a result, the LCD device has a sufficient property in a contrast ratio, a residual image and reliability. However, when the second alignment layer 44 has the third thickness of about 120 Å, the alignment film 40 has a relatively weak alignment force. As a result, a contrast ratio of the LCD device is reduced, a residual image level of the LCD device increases, and reliability at a relatively high temperature of the LCD device is deteriorated. Accordingly, deterioration such as yogore occurs in the LCD device.

SUMMARY

Aspects of the present disclosure relate to a substrate for a display device where a property such as a contrast ratio, a residual image and a reliability is improved by forming an alignment film of a single-layered structure due to an ultraviolet irradiation onto an alignment material including a photo-alignment material and a conductive particle, a liquid crystal display device including the substrate and a method of fabricating the substrate.

One or more aspects relate to a substrate where a thickness of an alignment film is reduced, a fabrication cost is reduced and a degree of freedom of design increases by forming for a touch display device where an initial parasitic capacitance is reduced and a touch sensing property and an image displaying property are improved by forming an alignment film of a single-layered structure due to an ultraviolet irradiation onto an alignment material including a photo alignment material having a decomposition type photo reactive group and a conductive particle, a liquid crystal display device including the substrate and a method of fabricating the substrate.

Advantages and features of the disclosure will be set forth in part in the description, which follows and in part will become apparent to those having ordinary skill in the art upon examination of the following or may be learned from practice of the disclosure. Other advantages and features of the aspects herein may be realized and attained by the structure particularly pointed out in the written description and claims hereof as well as the appended drawings.

It is to be understood that both the foregoing general description and the following detailed description are explanatory, and are intended to provide further explanation of the aspects as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of aspects of the disclosure.

In the drawings.

DETAILED DESCRIPTION

Figure 1A:
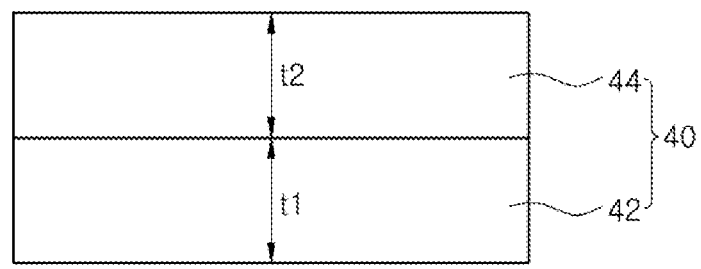
FIGS. 1A and 1B are views showing an alignment film of a double-layered structure according to the related art before and after an ultraviolet irradiating process, respectively.
Figure 1B:
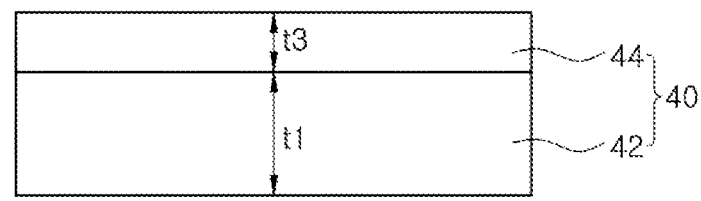

Reference will now be made in detail to aspects of the present disclosure, examples of which are illustrated in the accompanying drawings. In the following description, when a detailed description of well-known functions or configurations related to this document is determined to unnecessarily cloud a gist of an aspect of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
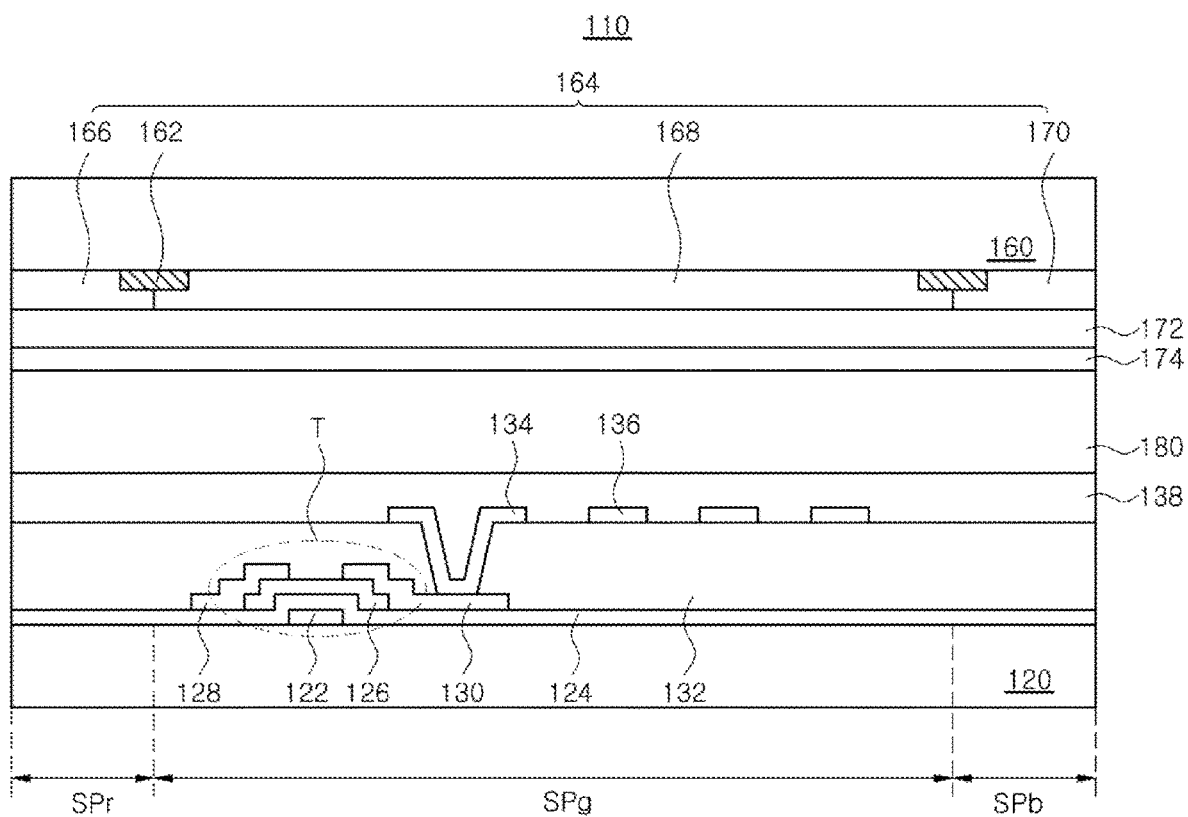
FIG. 2 is a cross-sectional view showing a liquid crystal display device according to an aspect of the present disclosure.

FIG. 2 is a cross-sectional view showing a liquid crystal display device according to an aspect of the present disclosure.

In FIG. 2, a liquid crystal display (LCD) device 110 according to an aspect of the present disclosure includes first and second substrates 120 and 160 facing and spaced apart from each other, a liquid crystal layer 180 between the first and second substrates 120 and 160 and a backlight unit (not shown) under the first substrate 120. The first and second substrates 120 and 160 include red, green and blue sub-pixel regions SPr, SPg and SPb.

A gate line (not shown) and a data line (not shown) crossing each other and defining the red, green and blue sub-pixel regions SPr, SPg and SPb are formed on an inner surface of the first substrate 120. A thin film transistor (TFT) T connected to the gate line and the data line is formed in each of the red, green and blue sub-pixel regions SPr, SPg and SPb and includes a gate line 122, a semiconductor layer 126, a source electrode 128 and a drain electrode 130.

A gate insulating layer 124 is formed between the gate electrode 122 and the semiconductor layer 126, and a passivation layer 132 is formed on the TFT T over an entire surface of the first substrate 120. Here, the gate electrode 122 and the source electrode 128 of the TFT T may be connected to the gate line and the data line, respectively.

A pixel electrode 134 connected to the drain electrode 130 of the TFT T and a common electrode 136 spaced apart from the pixel electrode 134 are formed on the passivation layer 132 in each of the red, green and blue sub-pixel regions SPr, SPg and SPb.

A first alignment film 138 is formed on the pixel electrode 134 and the common electrode 136 over the entire surface of the first substrate 120. The pixel electrode 134 and the common electrode 136 may have a bar shape and may include a metallic material or a transparent conductive material. In addition, the pixel electrode 134 and the common electrode 136 may be disposed alternatively in each of the red, green and blue sub-pixel regions SPr, SPg and SPb.

Although the pixel electrode 134 and the common electrode 135 have the same layer as each other in FIG. 2, the pixel electrode 134 and the common electrode 135 may have layers different from each other with an interposed insulating layer in another aspect.

A black matrix 162 is formed on an inner surface of the second substrate 160 in a boundary region of the red, green and blue sub-pixel regions SPr, SPg and SPb, and a color filter layer 164 is formed on the black matrix 162 over an entire surface of the second substrate 160. The color filter layer 164 includes red, green and blue color filters 166, 168 and 170 corresponding to the red, green and blue sub-pixel regions SPr, SPg and SPb, respectively.

A planarizing layer 172 is formed on the color filter layer 164 over an entire surface of the second substrate 160, and a second alignment film 174 is formed on the planarizing layer 172 over the entire surface of the second substrate 160.

In the LCD device 110, when the TFT T is turned on according to a gate voltage of the gate line, a data voltage of the data line is applied to the pixel electrode 134 through the TFT T. A horizontal electric field is generated between the pixel electrode 134 having the data voltage and the common electrode 136 having a common voltage, and a liquid crystal molecule of the liquid crystal layer 180 is realigned according to the horizontal electric field to display an image.

In the LCD device 110 according to an aspect of the present disclosure, at least one of the first and second alignment layers 138 and 174 is formed through an irradiation of a polarized ultraviolet onto an alignment material including a photo alignment material having a decomposition type photo reactive group and a conductive particle.

Figure 3:
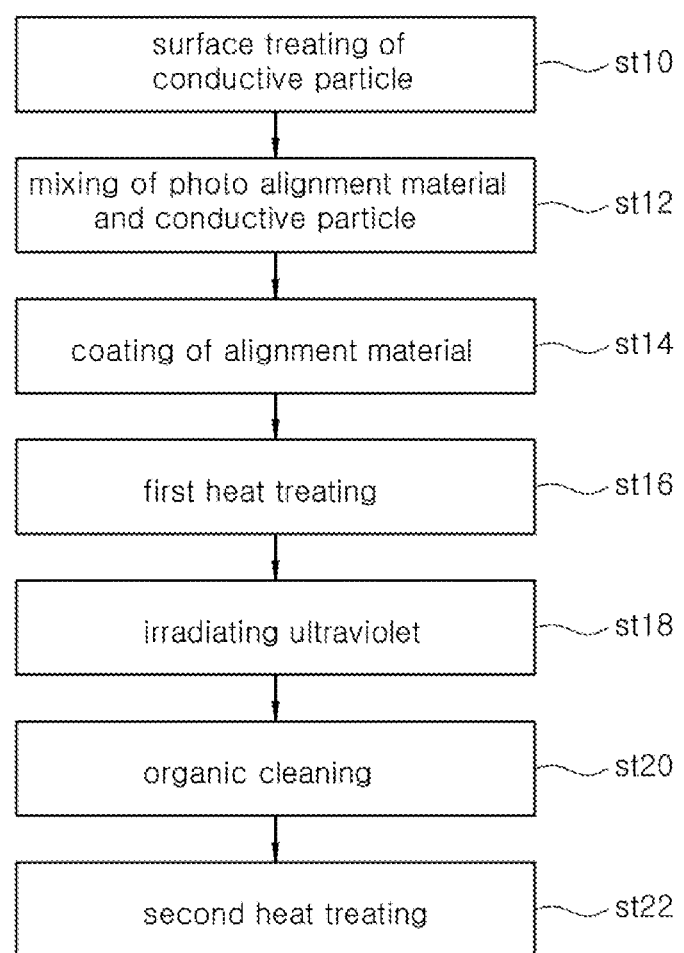
FIG. 3 is a flow chart showing a method of forming an alignment film according to an aspect of the present disclosure.
Figure 4:
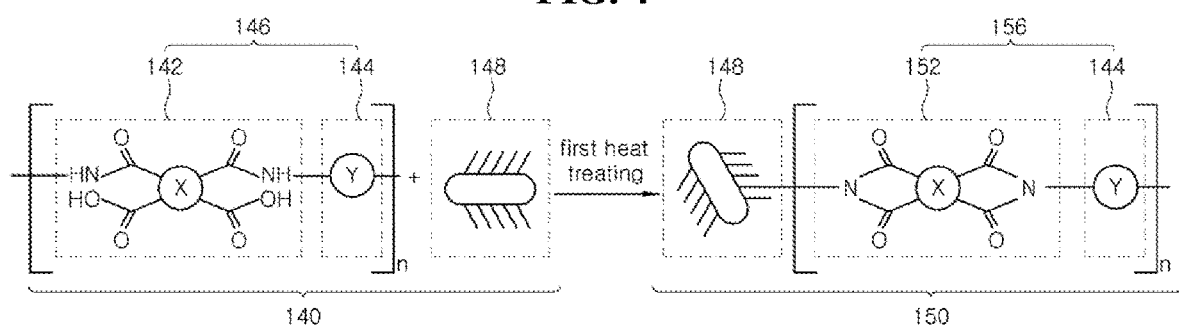
FIG. 4 is a view showing a structure of an alignment film according to an aspect of the present disclosure before and after a first heat treating process.

FIG. 3 is a flow chart showing a method of forming an alignment film according to an aspect of the present disclosure, and FIG. 4 is a view showing a structure of an alignment film according to an aspect of the present disclosure before and after a first heat treating process.

In FIGS. 3 and 4, for dispersing a conductive particle 148 into a photo-alignment material 146 uniformly, a surface treating process is performed to the conductive particle 148 (st10).

The conductive particle 148 may include a metallic particle or a carbonic particle having a diameter of about 1 nm to about 999 nm. For example, the metallic particle may include one of silver (Ag) and platinum (Pt), and the carbonic particle may include one of carbon nano tube (CNT), grapheme and carbon black.

Specifically, the carbon nano tube has advantages such that a resistivity level may be easily controlled and a dispersion degree may be controlled according to a surface treatment method of the carbon nano tube when the carbon nano tube is mixed with an alignment material of polyimide group.

The carbon nano tube is a material having a conductor property or a semiconductor property depending upon the size of a diameter. As a result, when the carbon nano tube is mixed with a photo-alignment material 146 having a non-conductor property, a resistivity of a mixed material and a whole alignment film is sharply reduced according to the increase of a content of the carbon nano tube and the increase of a length of the carbon nano tube.

Accordingly, the carbon nano tube of a multi wall nano tube (MWNT) structure having a relatively low electric conductivity may be used as the conductive particle 148 as compared with the carbon nano tube of a single wall nano tube (SWNT) structure.

In addition, for preventing a sharp reduction of the resistivity of a whole alignment film, the carbon nano tube may have a length less than about 100 nm.

A resistivity of the first and second alignment films 138 and 174 may be reduced without an influence on an alignment force of the first and second alignment films 138 and 174 by adding the conductive particle 148 with a content greater than 0 wt % and equal to or smaller than about 1.0 wt %. To prevent excess of a percolation threshold and generation of an electric networking path in the first and second alignment films 138 and 174 due to aggregation of the conductive particle 148, the surface treatment is performed to the conductive particle 148 before the conductive particle 148 is added to the photo-alignment material 146.

The surface treatment to the conductive particle 148 may be performed through an immersion method using a surface treatment solution such as acetone, isopropyl alcohol (IPA) or amic acid. For example, after the conductive particle 148 is dipped into the surface treatment solution, a solvent is removed and a surface of the conductive particle 148 is inactivated by drying the conductive particle 148. As a result, aggregation of the conductive particle 148 is prevented and dispersibility of the conductive particle 148 increases.

Next, an alignment material is formed by mixing the conductive particle 148 through the surface treating process to the photo-alignment material 146 (st12).

Since the surface of the conductive particle is inactivated, aggregation of the conductive particle 148 is prevented and dispersibility of the conductive particle 148 increases. As a result, the conductive particle 148 may be uniformly mixed with the photo-alignment material 146. The conductive particle 148 may have a content greater than 0 wt % and equal to or smaller than about 1.0 wt % with respect to the entire alignment material 146.

When the content of the conductive particle 148 is 0 wt % (i.e., when the conductive particle 148 is not added to the photo-alignment material 146), the alignment film may have a resistivity greater than a level of about $10^{15}$ Ωcm and a property of a contrast ratio, a residual image and a high temperature reliability may be deteriorated. When the content of the conductive particle 148 is greater than about 1.0 wt %, the alignment film may have a resistivity smaller than a level of about $10^{10}$ Ωcm by an electric networking path generated in the alignment film and the LCD device 110 may be abnormally operated due to an electric shortage between the pixel electrode 134 and the common electrode 136.

Here, the photo-alignment material 146 including a decomposition type photo-reactive group 142 and an alignment group 144 may be represented by a following chemical formula 1. X of the decomposition type photo-reactive group 142 may include cyclobutane with carbon number equal to or more than 4 represented by a following chemical formula 2 and its derivatives. The decomposition type photo-reactive group 142 may include dianhydride including X, and Y of the alignment group 144 may include aromatic group with carbon number equal to or more than 6 represented by a following chemical formula 3.

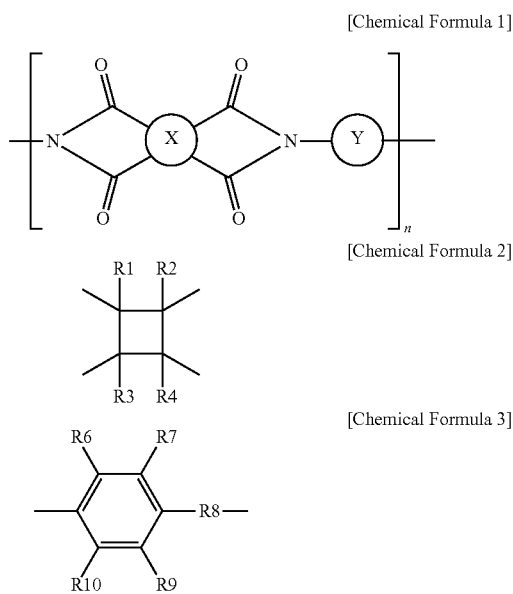

[Chemical Formula 1]

[Chemical Formula 2]

[Chemical Formula 3]

Here, each of R1, R2, R3 and R4 may include at least one of hydrogen atom, fluorine atom, chlorine atom, bromine atom, phenyl group, alkyl group with carbon number of 1 to 6, alkoxy group with carbon number of 1 to 6, vinyl group (—$(CH_2)_m$CH=$CH_2$, m=0~2) and acetyl group (—$(CH_2)_m$—C≡CH, m=0~2).

In addition, each of R6, R7, R8, R9 and R10 may include at least one of hydrogen atom, fluorine atom, chlorine atom, bromine atom, alkyl group with carbon number of 1 to 6, alkoxy group with carbon number of 1 to 6, vinyl group (—$(CH_2)_m$CH=$CH_2$, m=0~2) and acetyl group (—$(CH_2)_m$—C≡CH, m=0~2).

The photo alignment material 146 may have one of a polyamic acid type and a soluble polyimide type, and the completed alignment film may have an imidization rate equal to or greater than 80%. The alignment film except for the conductive particle may have a resistivity equal to or greater than a level of about $10^{15}$ Ωcm.

Next, the alignment material 140 including the photo alignment material 146 and the conductive particle 148 is coated on the first substrate 120 having the pixel electrode 134 and the common electrode 136 or the second substrate 160 having the planarizing layer 172 to form the alignment material layer (not shown) (st14).

Next, a first heat treating process (heating process) is performed to the coated alignment material layer (st16). A moisture ($H_2O$) is removed from the photo reactive group 142 of the photo alignment material 146 of the alignment material layer by the first heat treating to form an imidized photo alignment material 156 including an imidized photo reactive group 152. The conductive particle 148 is combined to the imidized photo reactive group 152 of the imidized photo alignment material 156 to form an imidized alignment material 150.

For example, the first heat treating process may be performed at a temperature of about 200° C. to about 250° C. for about 1000 sec to about 2000 sec.

A drying process for removing a solvent may be performed before the first heat treating. For example, the drying process may be performed at a temperature of about 50° C. to about 120° C. for about 80 sec to about 120 sec.

Next, a polarized ultraviolet is irradiated onto the alignment material layer where the first heat treating process is performed (st18). Through irradiating the polarized ultraviolet, a part of the imidized photo reactive group 152 parallel to a polarization direction of the polarized ultraviolet decomposes, and the other part of the imidized photo reactive group 152 perpendicular to the polarization direction of the polarized ultraviolet does not decompose to remain. The polarized ultraviolet may have a wavelength of about 254 nm.

Next, an organic cleaning process is performed to the alignment material layer where the polarized ultraviolet is irradiated (st20). A decomposition by-product of the photo reactive group 152 may be removed by the organic cleaning process.

Next, a second heat treating may be performed to the alignment material layer where the organic cleaning process is performed to complete a first alignment film 138 or a second alignment film 174 (st22). The decomposition by-product in the alignment material layer may be vaporized to be removed or may be realigned to be perpendicular to the polarization direction of the polarized ultraviolet by the second heat treating process.

Further, a part not perpendicular to the polarization direction of the polarized ultraviolet may be realigned to be perpendicular to the polarization direction of the polarized ultraviolet.

For example, the second heat treating process may be performed at a temperature of about 200° C. to about 250° C. for about 1000 sec to about 2000 sec.

The completed first alignment film 138 or the completed second alignment film 174 may have a resistivity of a level of about $10^{13}$ Ωcm to about $10^{15}$ Ωcm.

A whole of the completed first alignment film 138 or the completed second alignment film 174 contributes to an alignment force. As a result, the completed first alignment film 138 or the completed second alignment film 174 may have a sufficient alignment force even when the completed first alignment film 138 or the second completed alignment film 174 using the alignment material layer of a thickness of about 500 Å has a thickness of about 400 Å to about 450 Å. Accordingly, a cost of the organic cleaning process and the heat treating process is reduced and the fabrication cost is reduced.

Consequently, in the substrate, the LCD device including the substrate and the method of fabricating the substrate, the alignment film of a single-layered structure having a relatively small thickness and a relatively low resistivity is formed without reduction of the alignment force by using the alignment material including the photo alignment material having the decomposition type photo reactive group and the conductive particle. As a result, properties of the contrast ratio, the residual image and the reliability are improved, the fabrication cost is reduced, and the degree of freedom of design increases.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a substrate for a liquid crystal display device, comprising:
    forming a thin film transistor on a substrate;
    forming a passivation layer on the thin film transistor;
    forming a pixel electrode on the passivation layer, the pixel electrode connected to the thin film transistor;
    forming a common electrode spaced apart from the pixel electrode;
    forming an alignment material layer on the pixel electrode and the common electrode by coating an alignment material including a photo alignment material and a conductive particle;
    first heat treating the alignment material layer for imidizing the alignment material;
    irradiating an ultraviolet onto the alignment material layer for assigning an alignment property to the alignment material;
    organic cleaning the alignment material layer for removing a decomposition by-product of the alignment material; and
    second heat treating the alignment material layer for completing an alignment film by reinforcing the alignment property of the alignment material,
    wherein the alignment film has a resistivity of $10^{13}$ Ωcm to $10^{15}$ Ωcm.

2. The method of claim 1, wherein the conductive particle includes a metallic particle having one of silver (Ag) and platinum (Pt), or a carbonic particle having one of carbon nano tube (CNT), grapheme and carbon black.

3. The method of claim 2, wherein the carbon nano tube has a multi wall nano tube structure and a length less than 100 nm.

4. The method of claim 1, wherein the conductive particle is greater than 0 wt % and equal to or smaller than 1.0 wt % with respect to the alignment material.

5. The method of claim 1 further comprising surface treating the conductive particle for uniformly dispersing the conductive particle in the photo alignment material before coating the alignment material.

6. The method of claim 5, wherein the surface treating the conductive particle is performed through an immersion method using a surface treatment solution including one of acetone, isopropyl alcohol and amic acid.

7. The method of claim 1, further comprising drying the alignment material layer for removing a solvent of the alignment material layer.

8. The method of claim 7, wherein the drying the alignment material layer is performed at a temperature of 50° C. to 120° C. for 80 sec to 120 sec.

9. The method of claim 7, wherein the first heat treating the alignment material layer is performed at a temperature of 200° C. to 250° C. for 1000 sec to 2000 sec.

10. The method of claim 7, wherein the second heat treating the alignment material layer is performed at a temperature of 200° C. to 250° C. for 1000 sec to 2000 sec.

* * * * *